United States Patent
Cho

(10) Patent No.: US 7,301,407 B2
(45) Date of Patent: Nov. 27, 2007

(54) CAPACITOR BANK AND VOLTAGE CONTROLLED OSCILLATOR HAVING THE SAME

(75) Inventor: Je-Kwang Cho, Sungnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 59 days.

(21) Appl. No.: 11/061,801

(22) Filed: Feb. 18, 2005

(65) Prior Publication Data

US 2005/0184812 A1    Aug. 25, 2005

(30) Foreign Application Priority Data

Feb. 20, 2004   (KR) ...................... 10-2004-0011239

(51) Int. Cl.
*H03L 7/00*    (2006.01)
(52) U.S. Cl. ............................... 331/36 C; 331/177 V; 331/185
(58) Field of Classification Search .............. 331/36 C, 331/177 V, 185, 117 R
See application file for complete search history.

(56) References Cited

U.S. PATENT DOCUMENTS

| | | | |
|---|---|---|---|
| 5,929,712 A * | 7/1999 | Kuriyama | 331/25 |
| 6,211,745 B1 * | 4/2001 | Mucke et al. | 331/117 R |
| 6,556,072 B1 | 4/2003 | Nicollini et al. | 327/554 |
| 2005/0190002 A1 * | 9/2005 | Takinami et al. | 331/117 R |
| 2005/0212609 A1 * | 9/2005 | Jasa et al. | 331/116 R |
| 2005/0212614 A1 * | 9/2005 | Peluso | 331/177 V |

OTHER PUBLICATIONS

Moon et al, A Fully Differential LC-VCO Using a New Varactor Control Structure, IEEE, vol. 14, Issue 9, Sep. 2004.*
Maxim 10MHz to 1050MHz Integrated RF Oscillator with Buffered Outputs, MAX2620.*

* cited by examiner

*Primary Examiner*—Robert Pascal
*Assistant Examiner*—Levi Gannon
(74) *Attorney, Agent, or Firm*—F. Chau & Assoc., LLC

(57) ABSTRACT

A capacitor bank includes a first node, a second node, first blocking capacitors, N first AMOS varactors, second blocking capacitors and N second AMOS varactors. The first blocking capacitors have first terminals connected to the first node and second terminals where a bias voltage is applied. The N first AMOS varactors have first terminals connected to the second terminals of the first block capacitors. The second blocking capacitors have first terminals connected to the second node and second terminals where the bias voltage is applied. The N second AMOS varactors have first terminals connected to the second terminals of the second blocking capacitors and second terminals connected to second terminals of the first AMOS varactors, respectively, wherein N binary coded signals are applied to the respective second terminals of the first AMOS varactors and the second AMOS varactors. Therefore, phase-noise degradation caused by the FM modulation may be avoided.

18 Claims, 6 Drawing Sheets

100

US 7,301,407 B2

CAPACITOR BANK AND VOLTAGE CONTROLLED OSCILLATOR HAVING THE SAME

CROSS-REFERENCE TO RELATED APPLICATION

This application claims priority under 35 USC § 119 to Korean Patent Application No. 2004-11239, filed on Feb. 20, 2004 in the Korean Intellectual Property Office, the disclosure of which is incorporated by reference herein in its entirety.

BACKGROUND OF THE INVENTION

1. Field of the Invention

The present invention relates to a capacity bank and a voltage-controlled oscillator having the same, capable of preventing phase noise degradation due to the FM modulation when common noise is introduced into the DC voltage of an oscillation node of the capacitor bank.

2. Description of the Related Art

As communication systems become increasingly complex, each single chip for a transceiver is generally designed with a voltage-controlled oscillator (VCO) that supports both multi-band communication and the use of multi-mode. A transceiver integrated circuit (IC) for mobile communication requires the VCO to operate over a wide frequency bandwidth. The VCO may include an active circuit, an LC tank and a capacitor bank.

FIG. 1 is a circuit diagram illustrating a conventional capacitor bank using a metal-insulator-metal (MIM) capacitor.

Since the MIM capacitors C1 to Cn are used in the capacitor bank in FIG. 1, common noise introduced to a terminal A or terminal B may not affect the capacitance of the capacitors. Therefore, the capacitor bank may result in no significant phase-noise degradation caused by frequency modulation (FM). However, a high quality factor (Q) is difficult to achieve in the capacitor bank of FIG. 1 because of the on-resistance of switches S1 to Sn that are serially connected to the MIM capacitors C1 to Cn. That is, when the voltage-controlled oscillator is designed for low noise and wide bandwidth environment, the MIM capacitor bank may not be used in the voltage-controlled oscillator.

To overcome the above disadvantages, a conventional capacitor bank employs NMOS varactors or PMOS varactors instead of the MIM capacitors, thus, removing the need for the switches. The conventional capacitor bank has a serial resistance that is lower than that of the capacitor bank of FIG. 1, and therefore, the conventional capacitor bank is suitable for low noise voltage-controlled oscillator.

FIG. 2 is a schematic view illustrating an NMOS varactor, a PMOS varactor and respective capacitance characteristics thereof.

As shown in FIG. 2, the capacitance of the metal oxide semiconductor (MOS) capacitor is a function of a voltage between both ends of the MOS capacitor, and thus the capacitance may be changed by common noise to generate the FM modulation. Additionally, phase noise degradation may be generated by the FM modulation. FIG. 2 shows variation of the capacitances of the NMOS varactor and the PMOS varactor. The MOS varactor is turned on or off by a gate-to-source voltage of the NMOS transistor or PMOS transistor while the source and drain is electrically shorted.

FIG. 3 is a cross-sectional view illustrating a structure of a conventional AMOS varactor.

The structure of the conventional AMOS varactor is disclosed in U.S. Pat. No. 6,211,745. The AMOS varactor of FIG. 3 may have a P-type gate formed on an N-type well (hereinafter, referred to as a P-GATE/N-WELL structure) or an N-type gate formed on a P-type well (hereinafter, referred to as an N-GATE/P-WELL structure).

When the varactor has the P-GATE/N-WELL structure, a source region 124 and a drain region 122 of the varactor have $N^+$ types and a well 120 of the varactor has an $N^-$ type. Additionally, a gate polysilicon 134 of the P type gate has a $P^+$ type and contacts 126 and 128 are composed of metal. When the varactor has the N-GATE/P-WELL structure, the source region 124 and the drain region 122 have the $P^+$ types and the well 120 has a $P^-$ type. Additionally, the gate polysilicon 134 has the $N^+$ types and the contacts 126 and 128 are composed of metal.

FIG. 4 is a schematic view illustrating characteristics of the conventional AMOS varactor in FIG. 3. Referring to FIG. 4, compared with the NMOS varactor or the PMOS varactor shown in FIG. 2, the capacitance of the AMOS varactor is substantially constant near the transition region of the capacitance.

FIG. 5 is a circuit diagram illustrating a conventional capacitor in a differential mode using the AMOS varactor in FIG. 3, which is disclosed in U.S. Pat. No. 6,211,745. Referring to FIG. 5, the conventional capacitor is implemented in a differential mode to have digitally controlled capacitance values of the AMOS varactors. For example, as shown in FIG. 5, a control signal B1 is applied to a node where a capacitor C11 and a capacitor C21 are coupled to each other and the capacitances of the AMOS varactors have binary coded value from a least significant bit (LSB) (or smallest) capacitance to a most significant bit (MSB) (or largest) capacitance. In other words, when the capacitor C11 of the AMOS varactors (C11 to C1n) is designated as a LSB capacitor having capacitance of C, a capacitor C11 has capacitance of $2^1 \times C$, and a capacitor C1n, i.e., the MSB capacitor, has capacitance of $2^{(n-1)} \times C$. Similarly, when the capacitor C21 of the AMOS varactors (C21 to C2n) is designated as the LSB capacitor having capacitance of C, a capacitor C21 has capacitance of $2^1 \times C$ and a capacitor C2n, i.e., the MSB capacitor, has capacitance of $2^{(n-1)} \times C$. Therefore, the AMOS varactor composing the capacitor bank is called a binary capacitor.

However, in the conventional capacitor bank in FIG. 5, capacitance values of the AMOS varactors C11 to C1n and C21 to C2n vary with a DC voltage at a terminal A 501 or a terminal B 503. Therefore, when common noise is introduced into the DC voltage at the terminal A 501 or terminal B of the capacitor bank, phase noise degradation due to FM modulation may occur.

Therefore, there exists a need for a capacitor bank, which can avoid the phase noise degradation due to FM modulation when common noise is introduced to the DC voltage of the oscillation node of the capacitor bank.

SUMMARY OF THE INVENTION

Exemplary embodiments of the present invention provide a capacitor bank to prevent the phase noise degradation due to FM modulation when the common noise is introduced to the DC voltage of the oscillation node.

In some embodiments of the present invention, a capacitor bank may include a first node; a second node; a plurality of first blocking capacitors, each of which has a first blocking capacitor first terminal connected to the first node, and a first blocking capacitor second terminal to which bias voltage is applied; a plurality of N first accumulation-mode MOS (AMOS) varactors, each of which has a first AMOS varactor first terminal connected to the first blocking capacitor second terminal, respectively; a plurality of second blocking capacitors, each of which has a second blocking capacitor first terminal connected to the second node, and a second blocking capacitor second terminal to which bias voltage is applied; and a plurality of N second accumulation-mode MOS (AMOS) varactors, each of which has a second AMOS varactor first terminal connected to the second blocking capacitor second terminal; and a second AMOS varactor second terminal connected to a first AMOS varactor second terminal, respectively, wherein N binary coded signal is applied to each of the first and second AMOS varactor second terminals.

In other exemplary embodiments of the present invention, a capacitor bank may include a first node; a second node; a plurality of first blocking capacitors, each of which has a first blocking capacitor first terminal connected to the first node; a plurality of N first accumulation-mode MOS (AMOS) varactors, each of which has a first AMOS varactor first terminal connected to a first blocking capacitor second terminal, respectively; a plurality of second blocking capacitors, each of which has a second blocking capacitor first terminal connected to the second node; and a plurality of N second accumulation-mode MOS (AMOS) varactors, each of which has a second AMOS varactor first terminal connected to a second blocking capacitor second terminal, and a second AMOS varactor second terminal connected to a first AMOS varactor second terminal, respectively, wherein N binary coded signals are applied to the first and second AMOS varactor second terminals, respectively, and inverted N binary coded signals are applied to the first and the second AMOS varactors first terminals, respectively.

Exemplary embodiments of the present invention may also provide a voltage-controlled oscillator including an oscillator active circuit having a first oscillation node and a second oscillation node; at least one inductor connected between the first and the second oscillation nodes; and a capacitor bank comprising a plurality of first and second blocking capacitors, each of the first blocking capacitor having a first blocking capacitor first terminal connected to the first oscillation node and each of the second blocking capacitor having a second blocking first terminal connected to the second oscillation node; a plurality of N first accumulation-mode MOS (AMOS) varactors, each of which has a first AMOS varactor first terminal connected to the first blocking capacitor second terminal, respectively; and a plurality of N second accumulation-mode MOS (AMOS) varactors, each of which has a second AMOS varactor first terminal connected to a second blocking capacitor second terminal, and a second AMOS varactor second terminals connected to a first AMOS varactor second terminal, respectively, wherein N binary coded signals are applied to the first and second AMOS varactors second terminals, respectively, and inverted N binary coded signals are applied to the first and second AMOS varactor first terminals.

BRIEF DESCRIPTION OF THE DRAWINGS

The present invention will become more apparent to those of ordinary skill in the art by describing, in detail, exemplary embodiments thereof with reference to the attached drawings, wherein like elements are represented by like reference numerals, which are given by way of illustration only and thus do not limit the exemplary embodiments of the present invention.

DETAILED DESCRIPTION OF THE EXEMPLARY EMBODIMENTS

Figure 1:
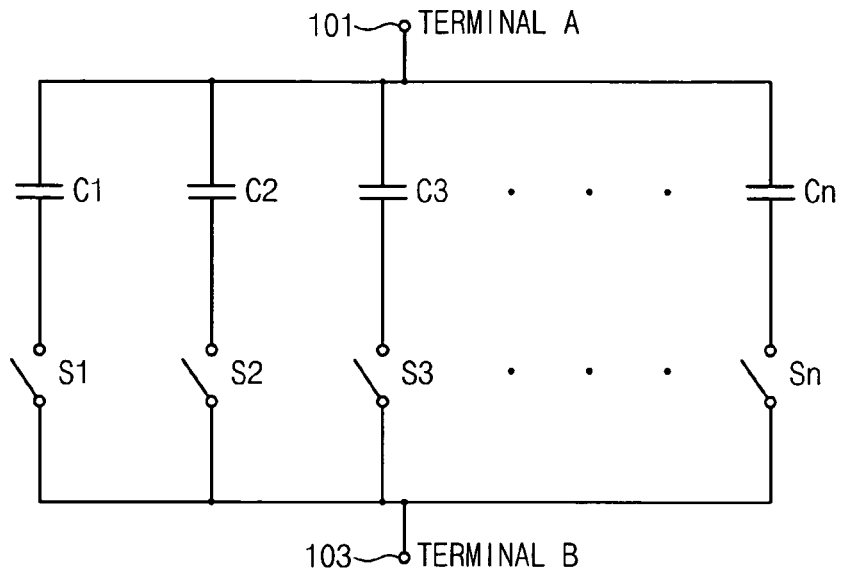
FIG. 1 is a circuit diagram illustrating a conventional capacitor bank using a metal-insulator-metal (MIM) capacitor.
Figure 2:
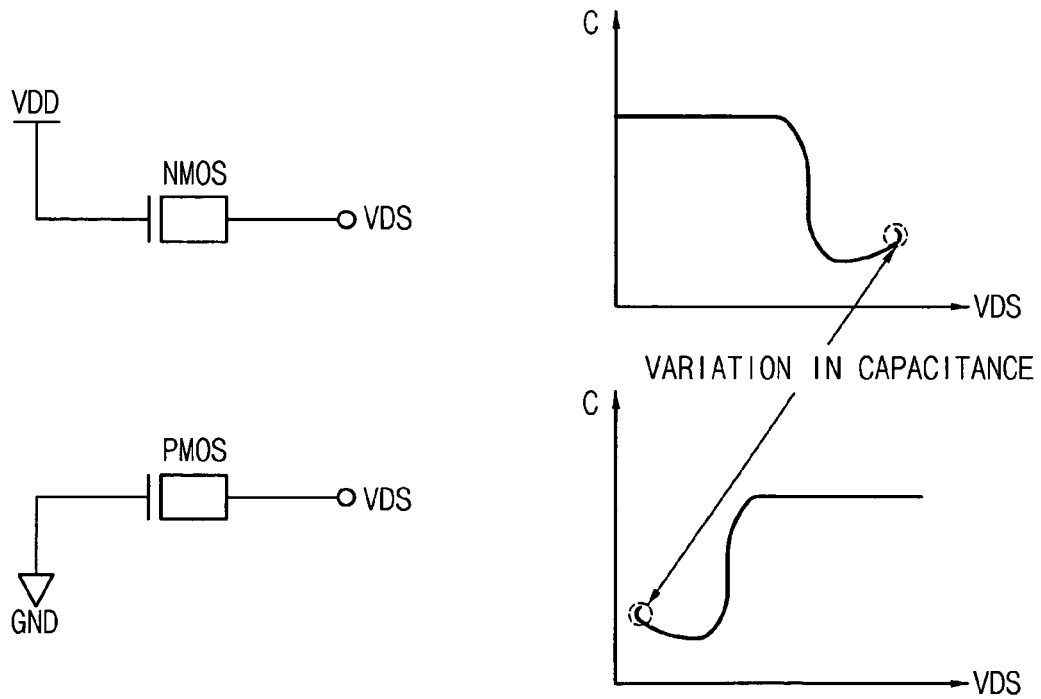
FIG. 2 is a schematic view illustrating an NMOS varactor, a PMOS varactor and respective capacitance characteristics thereof.
Figure 3:
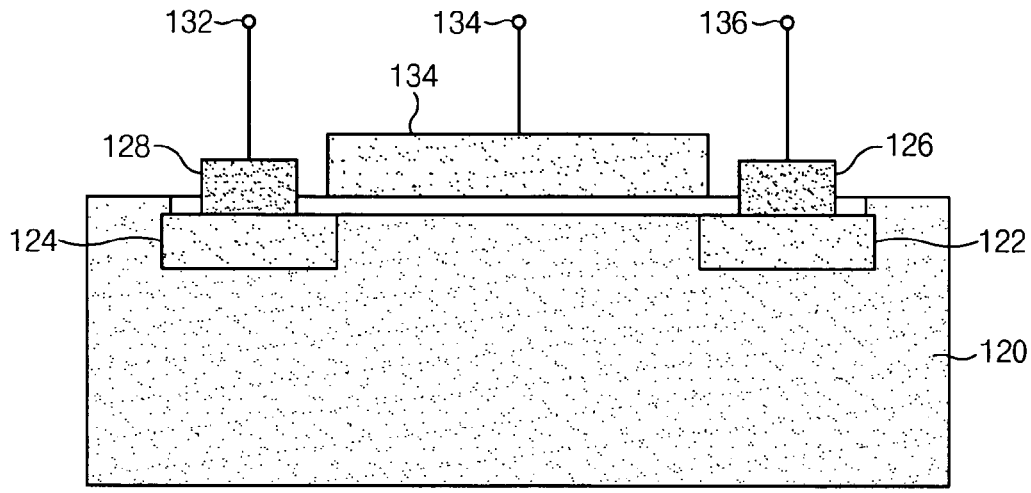
FIG. 3 is a cross-sectional view illustrating a structure of a conventional AMOS varactor.
Figure 4:
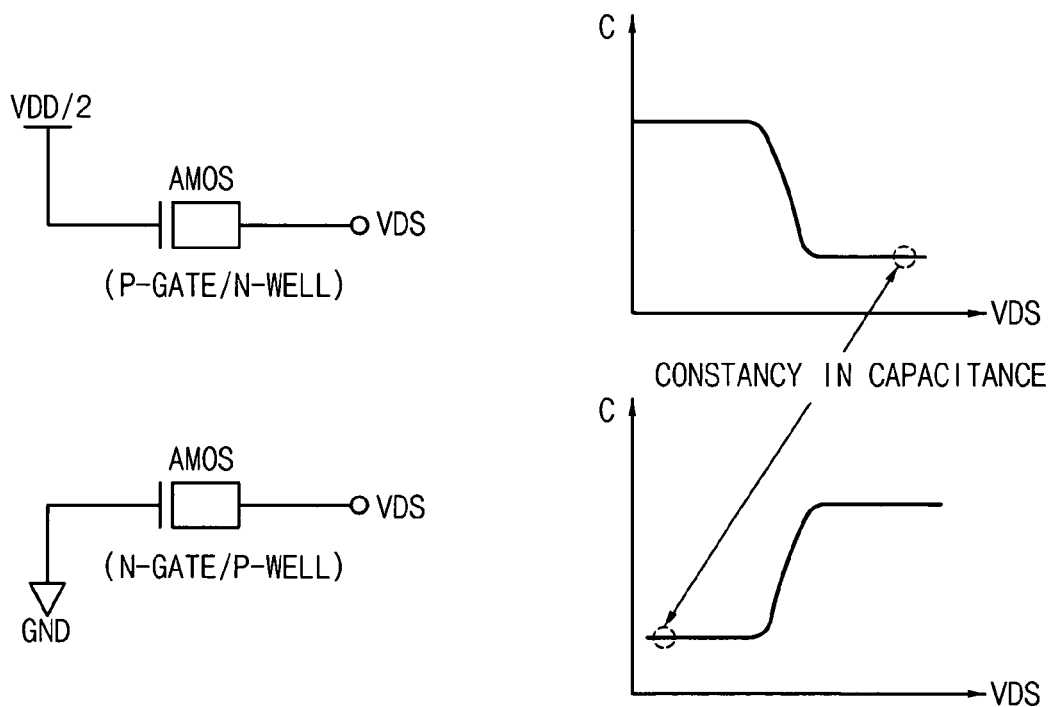
FIG. 4 is a schematic view illustrating characteristics of the conventional AMOS varactor in FIG. 3.
Figure 5:
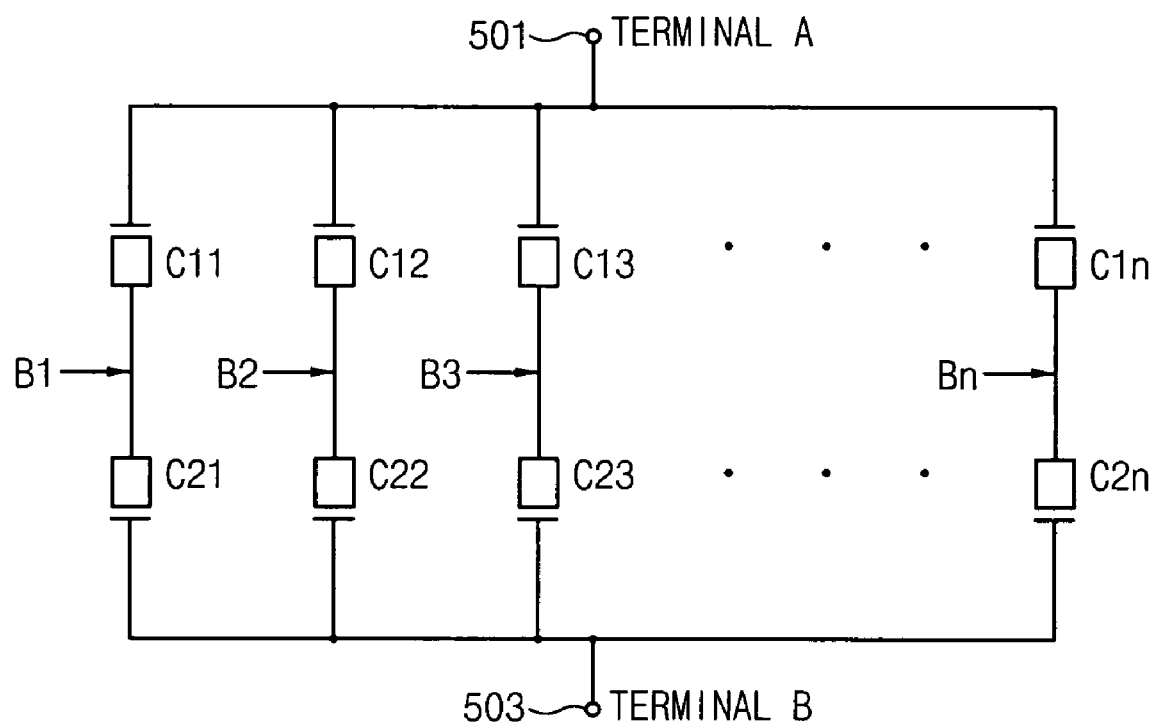
FIG. 5 is a circuit diagram illustrating a conventional capacitor bank in a differential mode using the AMOS varactor in FIG. 3.

The present invention will become more apparent to those of ordinary skill in the art by describing, in detail, exemplary embodiments thereof with reference to the attached drawings, wherein like elements are represented by like reference numerals, which are given by way of illustration only and thus do not limit the exemplary embodiments of the present invention.

Figure 6:
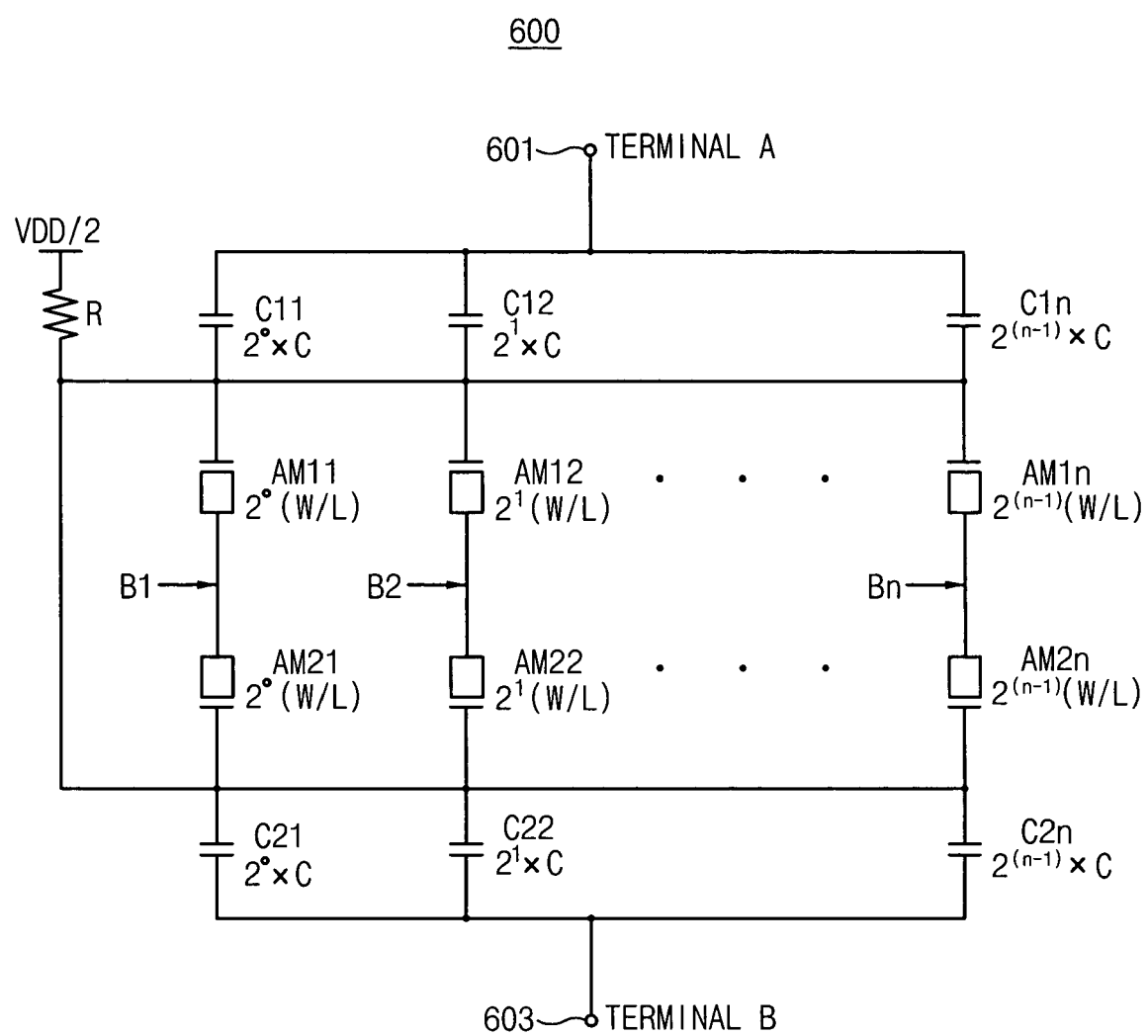
FIG. 6 is a circuit diagram illustrating in a differential mode using blocking capacitors and AMOS varactors according to an exemplary embodiment of the present invention.

FIG. 6 is a circuit diagram illustrating a capacitor bank in a differential mode using blocking capacitors and AMOS varactors according to an exemplary embodiment of the present invention.

Referring to FIG. 6, the capacitor bank 600 has a terminal A 601, a terminal B 603, first blocking capacitors C11 to C1$n$, first AMOS varactors AM11 to AM1$n$, second blocking capacitors C21 to C2$n$ and second AMOS varactors AM21 to AM2$n$.

The first blocking capacitors C11 to C1$n$ have first terminals commonly connected to the terminal A 601 and second terminals to which a bias voltage (VDD/2) is applied. The first AMOS varactors AM11 to AM1$n$ have first terminals connected to the second terminals of the first blocking capacitors C11 to C1$n$, respectively. That is, AM11 is connected to C11, AM12 to C12 and thus AM1$n$ to C1$n$.

The second blocking capacitors C21 to C2$n$ have first terminals connected to the terminal B 603 and second terminals to which the bias voltage (VDD/2) is applied. The second AMOS varactors AM21 to AM2$n$ have first terminals connected to the second terminals of the second blocking capacitors C21 to C2$n$, respectively, and second terminals connected to second terminals of the first AMOS varactors AM11 to AM1$n$, respectively. That is, AM21 is connected to C21, AM22 to C22 and thus AM2$n$ to C2$n$.

As shown in FIG. 6, N binary coded voltage signals B1 to B$n$ are applied to the second terminals of the first AMOS varactors AM11 to AM1$n$ and the second terminals of the second AMOS varactors AM21 to AM2$n$, respectively.

Referring to FIG. 6, the capacitor bank according to one exemplary embodiment is described below.

The terminals A and B (601 and 603) correspond to oscillation nodes of an oscillator. The first blocking capacitors C11 to C1n and the second blocking capacitors C21 and C2n have binary coded capacitances. That is, when the capacitance of the capacitor C11 is designated as $2^0 \times C$, the capacitance of the capacitor C12 is $2^1 \times C$, and the capacitance of the capacitor C1n is $2^{(n-1)} \times C$. Thus, the capacitor C11 is the least significant bit (LSB) capacitor and the capacitor C1n is the most significant bit (MSB) capacitor. Similarly, when the capacitance of the capacitor C21 is designated as $2^0 \times C$, the capacitance of the capacitor C22 is $2^1 \times C$, and the capacitance of the capacitor C2n is $2^{(n-1)} \times C$. Likewise, the capacitor C21 is the least significant bit (LSB) capacitor and the capacitor C2n is the most significant bit (MSB) capacitor.

The blocking capacitors C11 to C1n and C21 to C2n of capacitor bank in FIG. 6 prevent the common noise at the oscillation node from being introduced into the AMOS varactors so that the common noise does not affect the capacitance of the AMOS varactors.

The first AMOS varactors AM11 to AM1n and the second AMOS varactors AM21 to AM2n also have binary coded capacitances. The capacitance of the AMOS varactors is determined by the size (a ratio (W/L) of a channel width (W) of the transistor to a channel length (L) of the transistor). That is, when the size of the AMOS varactor AM11 is designated as $2^0 \times (W/L)$, the size of the AMOS varactor AM12 is $2^1 \times (W/L)$, and the size of the AMOS varactor AM1n is as $2^{(n-1)} \times (W/L)$. Thus, the AMOS varactor AM11 is the least significant bit (LSB) capacitor and the AMOS varactor AM1n is the most significant bit (MSB) capacitor. Similarly, when the size of the AMOS varactor AM21 is designated as $2^0 \times (W/L)$, the size of the AMOS varactor AM22 is $2^1 \times (W/L)$, and the size of the AMOS varactor AM2n is $2^{(n-1)} \times (W/L)$. Likewise, the AMOS varactor AM21 is the least significant bit (LSB) capacitor and the AMOS varactor AM2n is the most significant bit (MSB) capacitor.

As described above, the capacitance of the AMOS varactors are substantially constant relative to the variation of the voltage near the transition region of the capacitance value. Therefore, although common noise are introduced to DC voltages of the AMOS varactors AM11 to AM1n and AM21 to AM2n, the switched capacitor bank in FIG. 6 using the AMOS varactors may greatly reduce the phase-noise degradation caused by the FM modulation.

If the high level logics of the N binary voltage signals B1 to Bn correspond to voltage level of "VDD" and low level logic thereof correspond to voltage level of "0", then the AMOS varactors AM11 and AM21 may have voltage level of about –VDD/2 when the voltage signal B1 has a high level logic. When the voltage signal B1 has a low level logic, the AMOS varactors AM11 and AM21 may have voltage levels of about VDD/2. Similarly, the AMOS varactors AM12 and AM21 have voltage levels of about –VDD/2 when the voltage signal B2 has a high level logic. When the voltage signal B2 has a low level logic, the AMOS varactors AM11 and AM21 have voltage levels of about VDD/2.

Since the circuit of FIG. 6 has a symmetric structure with respect to each node where the N binary coded signals B1 to Bn are inputted, capacitance values may be digitally adjustable. In addition, since the blocking capacitors are serially coupled to the AMOS varactors, a voltage at the node where the blocking capacitor is coupled to the AMOS varactor may have a fixed voltage level of about VDD/2. Therefore, the capacitances of the AMOS varactors are easily adjustable using the N binary coded voltage signals B1 to Bn.

In FIG. 6, the first and second AMOS varactors may have the P-GATE/N-WELL structure or N-GATE/P-WELL structure.

Figure 7:
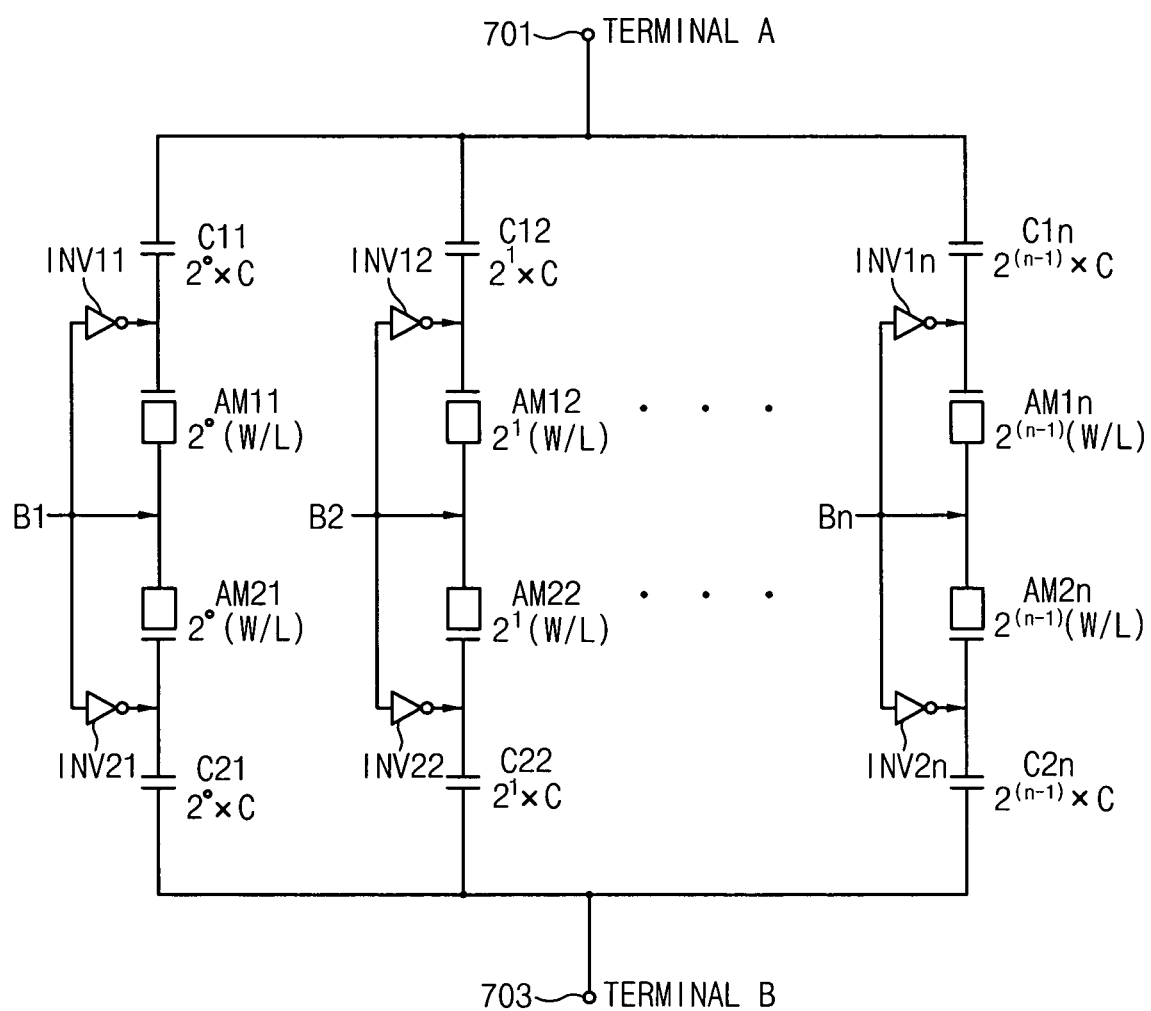
FIG. 7 is a circuit diagram illustrating in a differential mode using blocking capacitors and AMOS varactors according to another exemplary embodiment of the present invention.

FIG. 7 is a circuit diagram illustrating in a differential mode using blocking capacitors and AMOS varactors according to another exemplary embodiment of the present invention.

Referring to FIG. 7, the capacitor bank 700 includes a terminal A 701, a terminal B 703, first blocking capacitors C11 to C1n, first AMOS varactors AM11 to AM1n, second blocking capacitors C21 to C2n and second AMOS varactors AM21 to AM2n. Additionally, the capacitor bank 700 further includes inverters INV11 to INV1n and INV21 to INV2n for inverting binary coded signals B1 to Bn, respectively.

The first blocking capacitors C11 to C1n have first terminals commonly connected to the terminal A 701. The first AMOS varactors AM11 to AM1n have first terminals connected to second terminals of the first blocking capacitors C11 to C1n, respectively. That is, AM11 is connected to C11, AM12 to C12 and thus AM1n to C1n.

The second blocking capacitors C21 to C2n have first terminals commonly connected to the terminal B 703. The second AMOS varactors AM21 to AM2n have first terminals connected to second terminals of the second blocking capacitors C21 to C2n, respectively, and second terminals connected to second terminals of the first AMOS varactors AM11 to AM1n, respectively. The N binary coded voltage signals B1 to Bn are applied to the second terminals of the first AMOS varactors AM11 to AM1n and the second AMOS varactors AM21 to AM2n, respectively. In addition, the N binary coded voltage signals B1 to Bn are inverted by the inverters INV11 to INV1n and INV21 to INV2n and the inverted N voltage signals B1 to Bn are applied to the first terminals of the first AMOS varactors AM11 to AM1n and the first terminals of the second AMOS varactors.

Thus, the capacitor bank in FIG. 7 differs from the capacitor bank in FIG. 6 in that the inverted signals of the binary coded voltage signals B1 to Bn are applied to respective nodes where the blocking capacitors are coupled to the AMOS varactors.

Referring to FIG. 7, the capacitor bank according to another embodiment is described below.

In FIG. 7, it is assumed that voltage levels of the N binary voltage signals B1 to Bn having high level logics correspond to "VDD" and low level logic thereof correspond to voltage levels of "0".

When the voltage signal B1 has a high level logic (i.e., the voltage signal B1 has the voltage level of VDD), the low level voltages, i.e., "0", are applied to gates of the AMOS varactors AM11 and AM21. When the voltage signal B1 has a low level logic (i.e., the voltage signal B1 has the voltage level of 0), the high level voltages, i.e., "VDD", are applied to gates of the AMOS varactors AM11 and AM21.

While the AMOS capacitor in the capacitor bank in FIG. 6 has a voltage range from –VDD/2 to +VDD/2, the AMOS capacitor in the capacitor bank of FIG. 7 has a voltage range from –VDD to +VDD that is twice wide compared to that of the AMOS capacitor of FIG. 6. Therefore, under a condition of a low voltage, the capacitor bank of FIG. 7 will be more advantageous.

Figure 8:
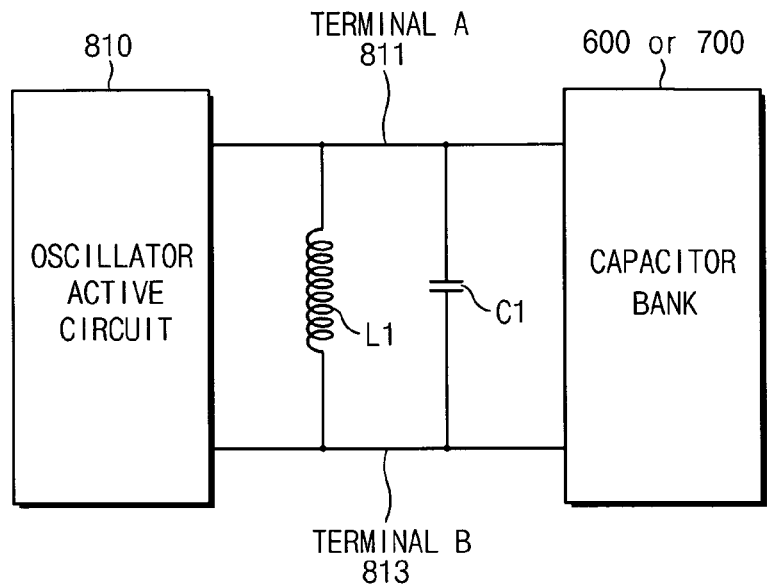
FIG. 8 is a schematic view illustrating a voltage-controlled oscillator using one of either the capacitor bank in FIG. 6 and the capacitor bank in FIG. 7.

FIG. 8 is a schematic view illustrating a voltage-controlled oscillator using the capacitor bank in FIG. 6 or the capacitor bank in FIG. 7.

Referring to FIG. 8, the voltage-controlled oscillator includes an oscillator active circuit 810, an inductor L1, a capacitor C1, a capacitor bank 600 (or 700).

Figure 9:
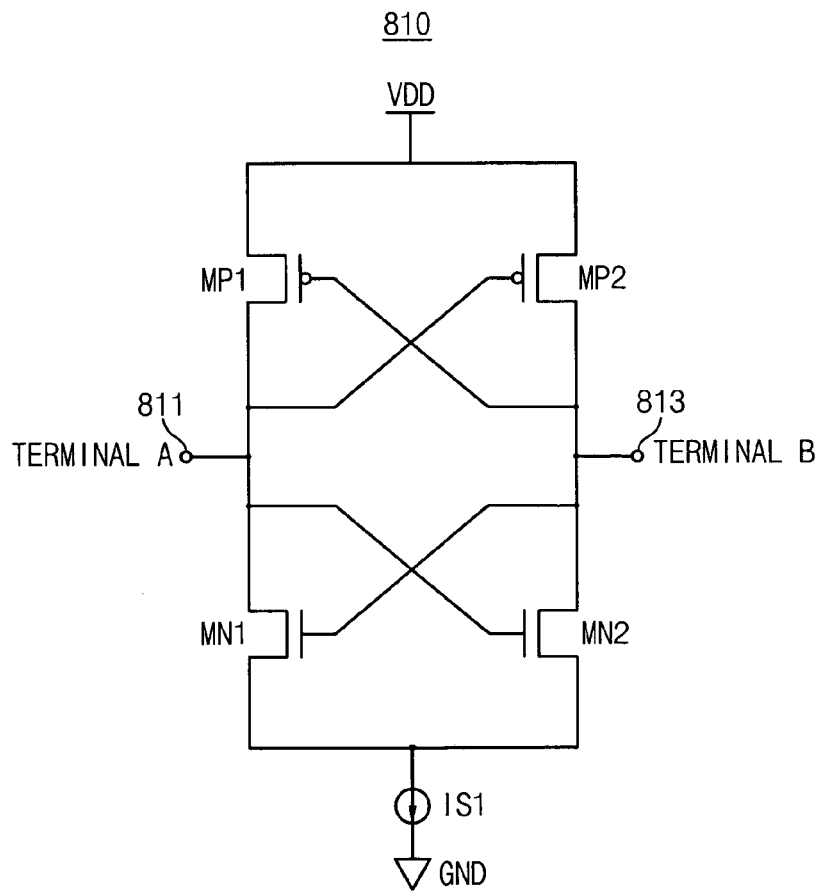
FIG. 9 is a circuit diagram illustrating an oscillator active circuit in FIG. 8.

The voltage-controlled oscillator of FIG. 8 may correspond to an LC oscillator whose oscillation frequency is determined by a resonant circuit consisting of the inductor L1, the capacitor C1 and the capacitor bank 600 (or 700). Alternatively, the voltage-controlled oscillator may have another configuration such as a ring oscillator. FIG. 9 is a circuit diagram illustrating the oscillator active circuit in FIG. 8.

Referring to FIG. 9, the active circuit 810 has PMOS transistors MP1 and MP2, and NMOS transistors MN1 and MN2, forming a latch structure. The PMOS transistor MP1 has a source connected to a power supply voltage VDD, a gate connected to the terminal B 813 and a drain connected to the terminal A 811. The PMOS transistor MP2 has a source connected to the power supply voltage VDD, a gate connected to the terminal A 811 and a drain connected to the terminal B 813.

The NMOS transistor MN1 has a drain connected to the terminal A 811 and a gate connected to the terminal B 813. The NMOS transistor MN2 has a drain connected to the terminal B 813 and a gate connected to the terminal A 811. A source of the NMOS transistor MN1 and a source of the NMOS transistor MN2 are commonly connected to an input terminal of the current source IS1. An output terminal of the current source IS1 is connected to a ground GND.

The oscillator active circuit of FIG. 9 latches voltages at the terminals A and B.

According to the exemplary embodiments of the present invention, when the common noise is introduced to the DC voltage of an oscillation node of the capacitor bank, the phase-noise degradation caused by the FM modulation may be avoided. Additionally, the voltage-controlled oscillator using the capacitor bank may be suitable for a low noise voltage-controlled oscillator having a wide frequency bandwidth. Additionally, the voltage-controlled oscillator may be implemented on a transceiver chip.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A capacitor bank comprising:
a first node;
a second node;
a plurality of first blocking capacitors, each of which has a first blocking capacitor first terminal connected to the first node, and a first blocking capacitor second terminal, wherein the same bias voltage of one-half of a known power supply voltage is applied to every first blocking capacitor second terminal;
a plurality of N first accumulation-mode MOS (AMOS) varactors, each of which has a first AMOS varactor first terminal connected to the first blocking capacitor second terminal, respectively;
a plurality of second blocking capacitors, each of which has a second blocking capacitor first terminal connected to the second node, and a second blocking capacitor second terminal, wherein the same bias voltage of one-half of a known power supply voltage is applied to every second blocking capacitor second terminal; and
a plurality of N second accumulation-mode MOS (AMOS) varactors, each of which has a second AMOS varactor first terminal connected to the second blocking capacitor second terminal, and a second AMOS varactor second terminal connected to a first AMOS varactor second terminal, respectively, wherein N binary coded control signals having a value of either the power supply voltage or zero are applied to the respective first AMOS varactors second terminals connected to the second AMOS varactors second terminals, whereby respective capacitances of the plurality of N first AMOS varactors and respective capacitances of the plurality of of N second AMOS varactors are adjusted using the N binary coded control signals.

2. The capacitor bank of claim 1, wherein both the first and second blocking capacitors comprise metal-insulator-metal (MIM) capacitors.

3. The capacitor bank of claim 1, wherein each plurality of first and second blocking capacitors comprises a most significant bit (MSB) capacitor having capacitance of 2(n−1)×C when a least significant bit (LSB) capacitor has capacitance designated as 20×C.

4. The capacitor bank of claim 1, wherein each plurality of first and second AMOS varactors comprises a most significant bit (MSB) varactor having a size of 2(n−1)×(W/L) when a least significant bit (LSB) varactor has a size designated as 20×(W/L), where W is a channel width and L is a channel length.

5. The capacitor bank of claim 1, wherein each of the first and second AMOS varactors has a structure in which a P-type gate is formed on an N-type well.

6. The capacitor bank of claim 1, wherein each of the first and second AMOS varactors has a structure in which an N type gate is formed on a P type well.

7. A capacitor bank comprising:
a first node;
a second node;
a plurality of first blocking capacitors, each of which has a first blocking capacitor first terminal connected to the first node;
a plurality of N first accumulation-mode MOS (AMOS) varactors, each of which has a first AMOS varactor first terminal connected to a first blocking capacitor second terminal, respectively;
a plurality of second blocking capacitors, each of which has a second blocking capacitor first terminal connected to the second node;
a plurality of N second accumulation-mode MOS (AMOS) varactors, each of which has a second AMOS varactor first terminal connected to a second blocking capacitor second terminal, and a second AMOS varactor second terminal connected to a first AMOS varactor second terminal, respectively, wherein N binary coded signals are applied to the respective first and second AMOS varactor second terminals; and
a plurality of inverters receiving the N binary coded signals for applying inverted N binary coded signals to the respective first and second AMOS varactor first terminals.

8. The capacitor bank of claim 7, wherein both the first and second blocking capacitors comprise metal-insulator-metal (MIM) capacitors.

9. The capacitor bank of claim 7, wherein each plurality of first and second blocking capacitors comprises a most significant bit (MSB) capacitor having capacitance of 2(n−1)×C when a least significant bit (LSB) capacitor has capacitance designated as 20×C.

10. The capacitor bank of claim 7, wherein each plurality of first and the second AMOS varactors comprises a most significant bit (MSB) varactor having a size of $2(n-1)\times(W/L)$ when a least significant bit (LSB) varactor has a size designated as $20\times(W/L)$.

11. The capacitor bank of claim 7, wherein each of the first and the second AMOS varactors has a structure in which a P-type gate is formed on an N-type well.

12. The capacitor bank of claim 7, wherein each of the first and the second AMOS varactors has a structure in which an N-type gate is formed on a P-type well.

13. A voltage-controlled oscillator, comprising:
an oscillator active circuit having a first oscillation output node and a second oscillation output node;
at least one inductor connected between the first and second oscillation output nodes;
a capacitor bank including a plurality of first blocking capacitors and a plurality of second blocking capacitors, each of the first blocking capacitors having a first blocking capacitor first terminal connected to the first oscillation output node and each of the second blocking capacitors having a second blocking capacitor first terminal connected to the second oscillation output node; a plurality of N first accumulation-mode MOS (AMOS) varactors, each of which has a first AMOS varactor first terminal connected to a first blocking capacitor second terminal, respectively; and a plurality of N second accumulation-mode MOS (AMOS) varactors, each of which has a second AMOS varactor first terminal connected to a second blocking capacitor second terminal, and a second AMOS varactor second terminal connected to a first AMOS varactor second terminal, respectively, wherein N binary coded signals are applied to the first and second AMOS varactor second terminals, respectively; and
a plurality of inverters receiving the N binary coded signals for applying inverted N binary coded signals to the first and second AMOS varactor first terminals.

14. The voltage-controlled oscillator of claim 13, wherein both the first and second blocking capacitors comprise metal-insulator-metal (MIM) capacitors.

15. The voltage-controlled oscillator of claim 13, wherein each plurality of first and second blocking capacitors comprises a most significant bit (MSB) capacitor having capacitance of $2(n-1)\times C$ when least significant bit (LSB) capacitor has capacitance designated as $20\times C$.

16. The voltage-controlled oscillator of claim 13, wherein each plurality of first and the second AMOS varactors comprises a most significant bit (MSB) varactor having a size of $2(n-1)\times(W/L)$ when a least significant bit (LSB) varactor has a size designated as $20\times(W/L)$, where W is a channel width and L is a channel length.

17. The voltage-controlled oscillator of claim 13, wherein each of the first and the second AMOS varactors has a structure in which a P-type gate is formed on an N-type well.

18. The voltage-controlled oscillator of claim 13, wherein each of the first and the second AMOS varactors has a structure in which an N-type gate is formed on a P-type well.

* * * * *